(12) United States Patent
Hollmer

(10) Patent No.: US 6,411,069 B1
(45) Date of Patent: Jun. 25, 2002

(54) CONTINUOUS CAPACITOR DIVIDER SAMPLED REGULATION SCHEME

(75) Inventor: Shane C. Hollmer, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/387,018

(22) Filed: Aug. 31, 1999

(51) Int. Cl.$^7$ ................................................ G05F 1/40
(52) U.S. Cl. ........................... 323/283; 323/288; 363/60
(58) Field of Search ........................... 363/60; 323/283, 323/282, 284, 288; 327/536

(56) References Cited

U.S. PATENT DOCUMENTS 4,404,624 A * 9/1983 Yamazaki ..................... 363/59
5,574,634 A * 11/1996 Parlour et al. ................ 363/59
6,040,736 A * 3/2000 Milanesi et al. ............. 327/541

* cited by examiner

*Primary Examiner*—Shawn Riley
(74) *Attorney, Agent, or Firm*—Fliesler, Dubb, Meyer & Lovejoy

(57) ABSTRACT

A refresh mechanism refreshes a supplied capacitor of a capacitor divider circuit at an interval that keeps an amount of charge degradation at a coupled up capacitor to less than a predetermined threshold. A node between the supplied capacitor and the coupled up capacitor provides a voltage sampling node having a divided voltage. Timing for the refresh operations may be established via internal clocks or internal oscillators running at multiples of other circuits already internal to the device utilizing the divided voltage. The divided voltage is then utilized for comparison, feedback (voltage regulation, for example), or other purposes. The invention is applicable to all types of circuits where degradation occurs due any type of leakage or other permutations affecting circuit operations.

17 Claims, 15 Drawing Sheets

CONTINUOUS CAPACITOR DIVIDER SAMPLED REGULATION SCHEME

COPYRIGHT NOTICE

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

BACKGROUND OF THE INVENTION

1. Field of Invention

This invention relates to voltage regulation. The invention is also related to dividing voltage sources. The invention is more particularly related to the division and provision of regulated voltage in microelectronic circuits. The invention is still more particularly related to the provision of capacitor divided voltage provided for power requirements of microelectronic devices, particulary flash memory devices.

2. Discussion of Background

Most electronic systems being designed today use some form of voltage regulation to ensure circuit stability in the face of changes in load current or supply voltage. In addition to being a requisite for proper or stable circuit operation, many times the circuit design can be simplified with resultant cost reductions if it is based on using a regulated supply. Regulated voltage supplies are also useful to provide a voltage level for comparison of other voltages, such as testing charge levels of other devices in an electronic device. The degree of accuracy that the voltage regulator must provide varies considerably with the function performed by the electronics. As a result, there are many different methods for providing the regulation available to the designer.

For many years gas tubes have been used to provide voltage regulation. This is because the characteristic maintaining voltage of these gas discharge tubes remains fairly constant over a relatively wide range of operating currents. Thus, they can absorb any reasonable voltage or current fluctuations occurring in normal operation, keeping the load voltage fairly constant. However, such devices have limited applicability and are not suitable for microelectronic devices.

Solid state voltage regulator diodes or Zeners have been popular since the late 1950's when they replaced bulky vacuum tubes. Zener diodes primarily serve as voltage regulators with variable operating currents when placed in parallel across a load to be regulated.

Generally speaking, voltage regulation within modern microelectronic devices utilize a voltage source which is regulated based on it's output. The process is illustrated in FIG. 1. At step 100, an output voltage is sampled. The output voltage is provided from a power supply. At step 110, the sampled voltage is compared to a know value or reference (band gap reference, for example). The reference can be any stable value which provides an indication as to whether the power supply is providing the required or designed power output. Finally at step 120, feedback from the step 110 comparison is fed back into the power supply to adjust the power level output (output voltage). In this manner a regulated power supply is provided.

FIG. 2 illustrates a typical arrangement of electronics for implementing the above described process. A voltage source 200 provides a supply voltage $V_{supply}$. The $V_{supply}$ is divided by resistor pair 210,220 to provide a divided voltage 230. The divided voltage 230 is typically divided from the $V_{supply}$ to provide a proper voltage level for any connected electronics and a design of the remaining circuit. In this case, the divided voltage provides a voltage for a comparison circuit 250.

The divided voltage 230 is input to the comparison circuit 250 and compared to a reference voltage 240. The comparison circuit 250 is a standard comparator or amplifier configured to produce some difference or adjustment between the divided voltage 230 and the reference voltage 240, producing a feedback voltage 260.

The feedback voltage 260 is then fed back into the voltage supply 200 where it has the effect of either lowering or increasing a voltage level produced, resulting in a regulated power supply. As thus illustrated, the circuit in FIG. 2 performs the method described above for power regulation and also illustrates a method of producing additional specific voltages (divided voltage 230, for example) from a single voltage source using a resistor divider (resistor pair 210, 220).

Resistor dividers are common methods for providing specific voltages from a single power source. However, such arrangements require that power is constantly drawn from the voltage source to provide the voltage, and are thus inefficient. One method that does not continuously draw power to provide a divided voltage is illustrated in FIG. 3. A capacitor pair 310,320 is shown that divides a voltage to produce a capacitor divided voltage 330. The capacitor divided voltage is provided to comparison circuit 250 to produce the feedback voltage 260.

The capacitor pair 310,320 are charged up by a voltage source similar to voltage source 200. FIGS. 4A–B illustrates the charge of the capacitors 310,329 charged up from t1 to t2, to provide a voltage level for comparison purposes. Unfortunately, capacitors leak charge (see t2 to t3, for example) or will have charge drawn from them for circuit operation and therefore are unsuitable for stable continuous operations.

SUMMARY OF THE INVENTION

The present inventor has realized that continuous current voltage dividers, such as resistor pairs, are unsuitable for modern electronic devices, particularly for on chip devices or pumps that have limited power resources. The present inventor has realized that capacitor dividers are an ideal way to maintain a voltage level for operating purposes within modern microelectronic devices, and that a method of maintaining a charge level in the capacitors without continuous power application would overcome the problems in the prior art.

Roughly described, the present invention provides a nominal power application at predetermined intervals to refresh and maintain a charge level in a capacitor voltage divider circuit. The refresh is performed by calculating an amount of time that a capacitor in the capacitor divider circuit maintains a sufficient charge, and, before that time period has expired, turning the circuit off and reinitializing the capacitors in the circuit, and turning the circuit back on. The timing is generally based on a period of the pump (or voltage supply) and utilizes detailed set of electronics to implement the selected timing regiment.

The present invention is a device that provides a selected voltage level with a minimum of power drain from a supply voltage. The present invention includes a refresh mechanism for initializing capacitor nodes of a capacitor voltage divider circuit to maintain a predetermined voltage division of a voltage source between a capacitor pair of the capacitor voltage divider.

An embodiment of the present invention includes a timing circuit capable of refreshing a capacitor voltage diver circuit at a frequency tied to a frequency of a pump supplying the voltage divider by the capacitor voltage divider circuit.

The present invention can be constructed from parts already present on a microelectronic circuit to implement the timing and functions of the present invention.

The invention may be embodied in either of: a sampling circuit having, a sampling node, and a refresh circuit configured to refresh the sampling circuit at an interval rate of less than an amount of time that charge leakage of the sampling circuit degrades a voltage measurement made at the sampling node beyond a threshold amount; and a regulated voltage supply, having a voltage source, a sampling circuit connected to an output of said voltage source and configured to sample the output without drawing current from said voltage source, and a feedback circuit configured to provide a signal that adjusts an amount of voltage supplied at the output based on the sampled output.

The invention may also be embodied in a method of sampling voltage, comprising the steps of: retrieving a voltage from a divided node of a capacitor divider circuit having a supplied capacitor and a coupled up capacitor, and refreshing the capacitor divider circuit at an interval rate of less time than an amount of time for charge leakage of the capacitor circuit to degrade the voltage retrieved from the divided node. In addition, the invention may be embodied as a set of instructions, stored on a computer readable media, when loaded into a computer, cause the computer to perform the above identified steps; and as a means for performing reinitializing a capacitor voltage division circuit at a refresh rate of less than a predetermined amount of charge leakage occurs in a coupled up capacitor of the capacitor voltage division circuit.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

A capacitor divider circuit is ideal for providing a divided voltage under low current/power situations where a current drain would materially degrade circuit operations. However, a voltage of the divided node of the capacitor divider circuit leaks over time causing the circuit to not perform correctly. The present invention allows for continuous use of a capacitor divider circuit for any purpose such as the provision of a divided voltage, or a sample voltage for power regulation.

Figure 1:
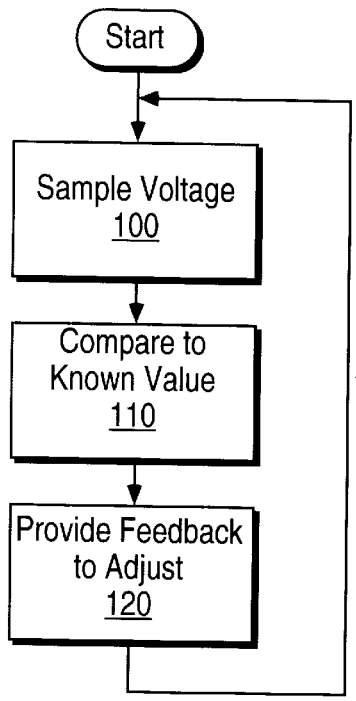
FIG. 1 is flow chart illustrating a conventional voltage regulation scheme.
Figure 2:
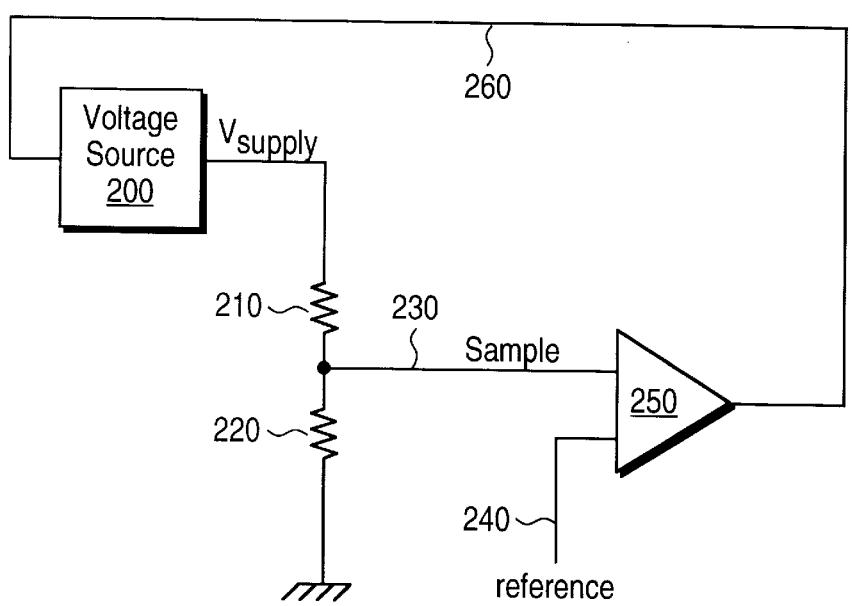
FIG. 2 is a circuit diagram illustrating a conventional voltage regulation and voltage division mechanism.
Figure 3:
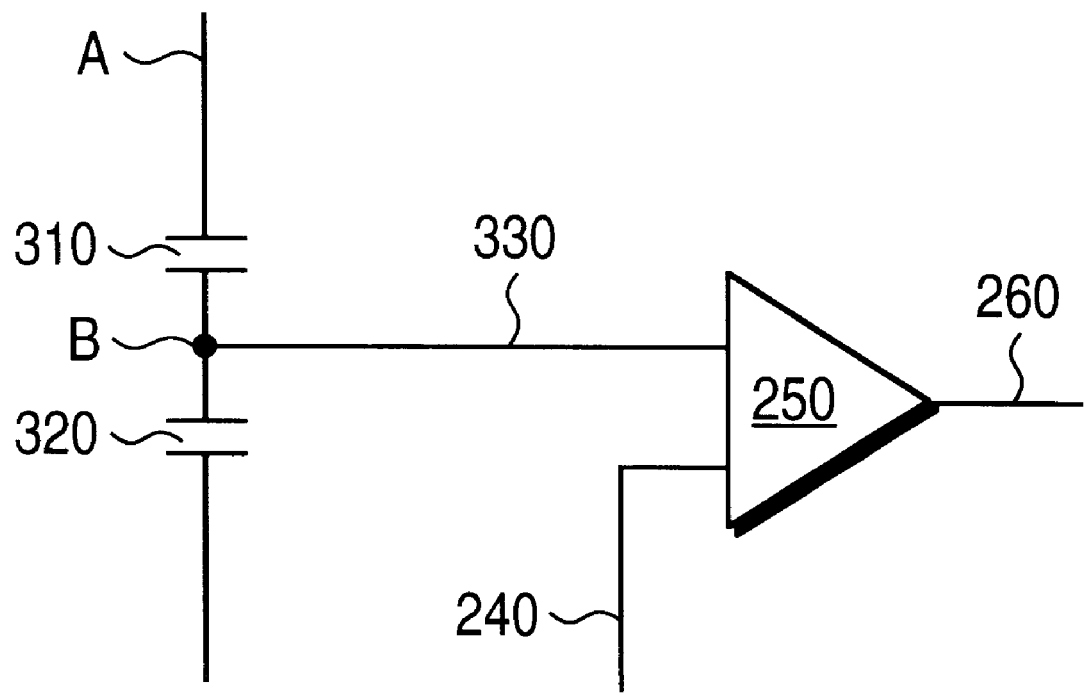
FIG. 3 is a circuit diagram illustrating a conventional capacitor divider utilized for voltage regulation.
Figure 4A:
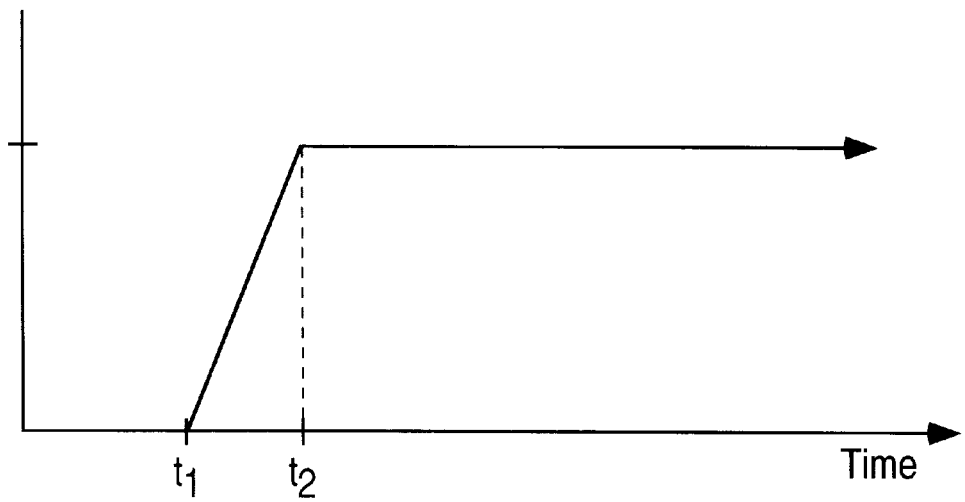
FIGS. 4A–B is a graph of charge leak or decay of a conventional capacitor voltage divider circuit.
Figure 4B:
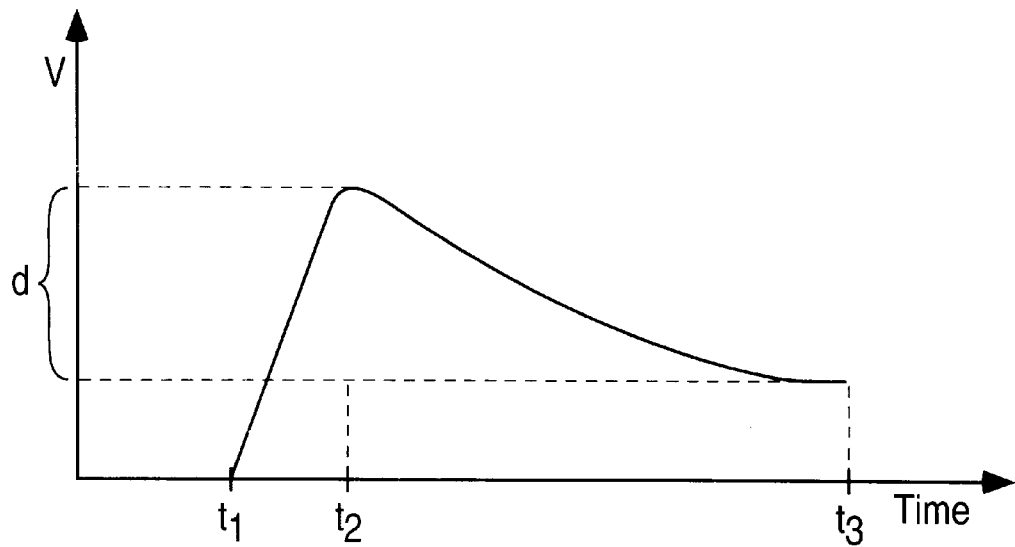

Referring again to the drawings, wherein like reference numerals designate identical or corresponding parts, and more particularly to FIGS. 4A–B thereof, it can be seen that the traditional capacitor divider, at node B, experiences significant charge decay within a short time period of being charged. Node A remains fully charged due to connection to a voltage supply.

The decay at node B results from the fact that the coupling up effect that charges capacitor 320 only occurs during a charge time of capacitor 310 (until time t2), at which point no more coupling up effect occurs and capacitor 320 begins to decay via a finite leakage that is known to occur in capacitor devices.

Figure 5A:
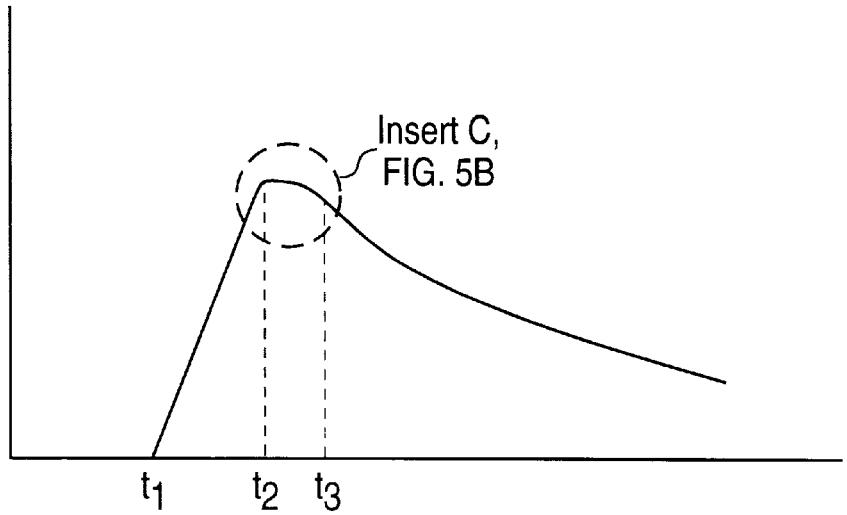
FIGS. 5A–B is a graph illustrating a close up of a charge of a coupled up capacitor in a capacitor divider circuit.
Figure 5B:
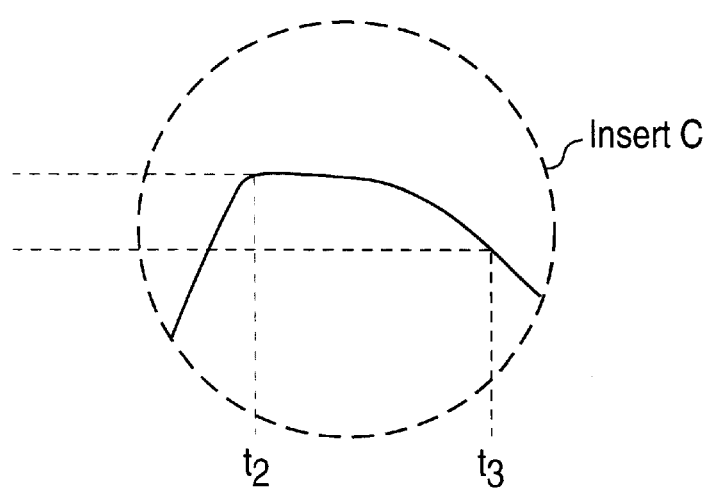

Referring now to FIGS. 5A–B, Inset C, a charge decay is shown for the short time period after being charged. An acceptable level of charge for many operations is maintained until approximately time $t_3$. For example, for a programming pulse that last 10 micro seconds, such a circuit would be completely acceptable. However, if a charge were to be maintained for seconds, or larger periods of a day, such an arrangement is unacceptable because the charge leaks away.

For voltage required for longer time intervals, the present invention proposes to disconnect the capacitor divider circuit to re-initialize the supplied and coupled up capacitors, before the decay of the coupled up capacitor has reached an unacceptable voltage level, and then reconnect it to allow the changing voltage of the now reinitialized supplied capacitor to refresh the coupled up capacitor.

Figure 6:
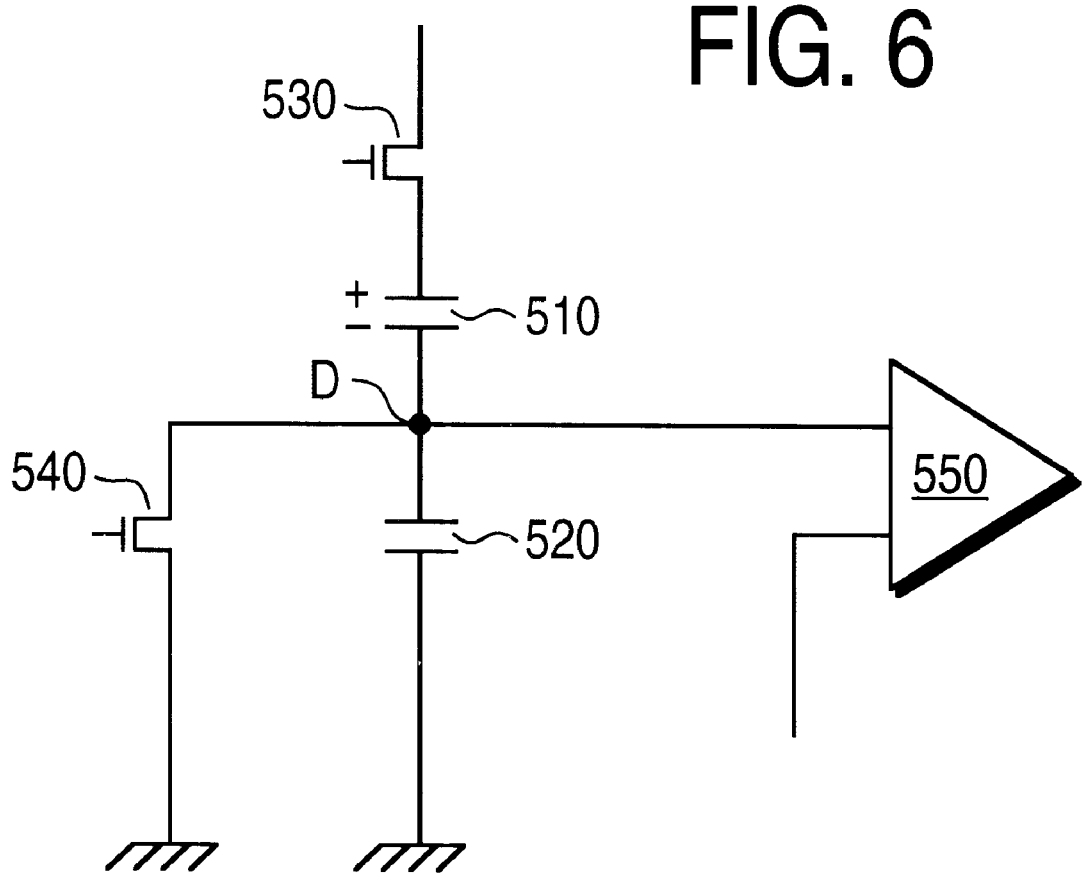
FIG. 6 is a circuit diagram illustrating one embodiment of separation circuitry for isolating a supplied capacitor in a capacitor divider circuit according to the present invention.

FIG. 6 illustrates some basic electronics for disconnecting the capacitor voltage divider circuit having capacitors 510 and 520 arranged as a supplied capacitor and a coupled up capacitor respectively. Transistor 530 is connected between the supplied capacitor 510 and a voltage to be divided. The transistor 530 is configured to either connect of disconnect the supplied capacitor from a voltage supply (not shown) that provides the voltage to be divided.

Transistor 540 is connected at a divided voltage node D and to ground, and is configured to be normally off, not altering the circuit, and to ground a negative terminal of capacitor 510, and a terminal of capacitor 520 when activated. Other methods or circuit arrangements for isolating the capacitor divider circuit or the supplied capacitor may also be utilized, as will now be apparent to those skilled in the art.

Once disconnected, the supplied capacitor 510 and coupled up capacitor 520 may then be re-initialized, i.e., the built up charge is zero-out or discharged. The timing is set such that the discharging of the supplied capacitor occurs after the circuit is disconnected, otherwise the discharge process will interfere with the operation of the pump, or power supply. The basic process is performed in three steps:

1) disconnect or isolate the supply capacitor;
2) Initialize (discharge/zero-out) the supplied capacitor and coupled up capacitor; and
3) reconnect the initialized supplied and coupled up capacitors.

The main principle of the invention is to refresh the capacitor divider circuit at an interval of time less than a leakage tolerance of the coupled up capacitor of the divider circuit.

In one embodiment the present invention is applied to a regulated power supply to sample a voltage from a power supply for comparison and calculation of feedback properties to the voltage supply. In another embodiment, the present invention is applied to a comparison circuit to compare against another on chip voltage level that is being tested.

Figure 7:
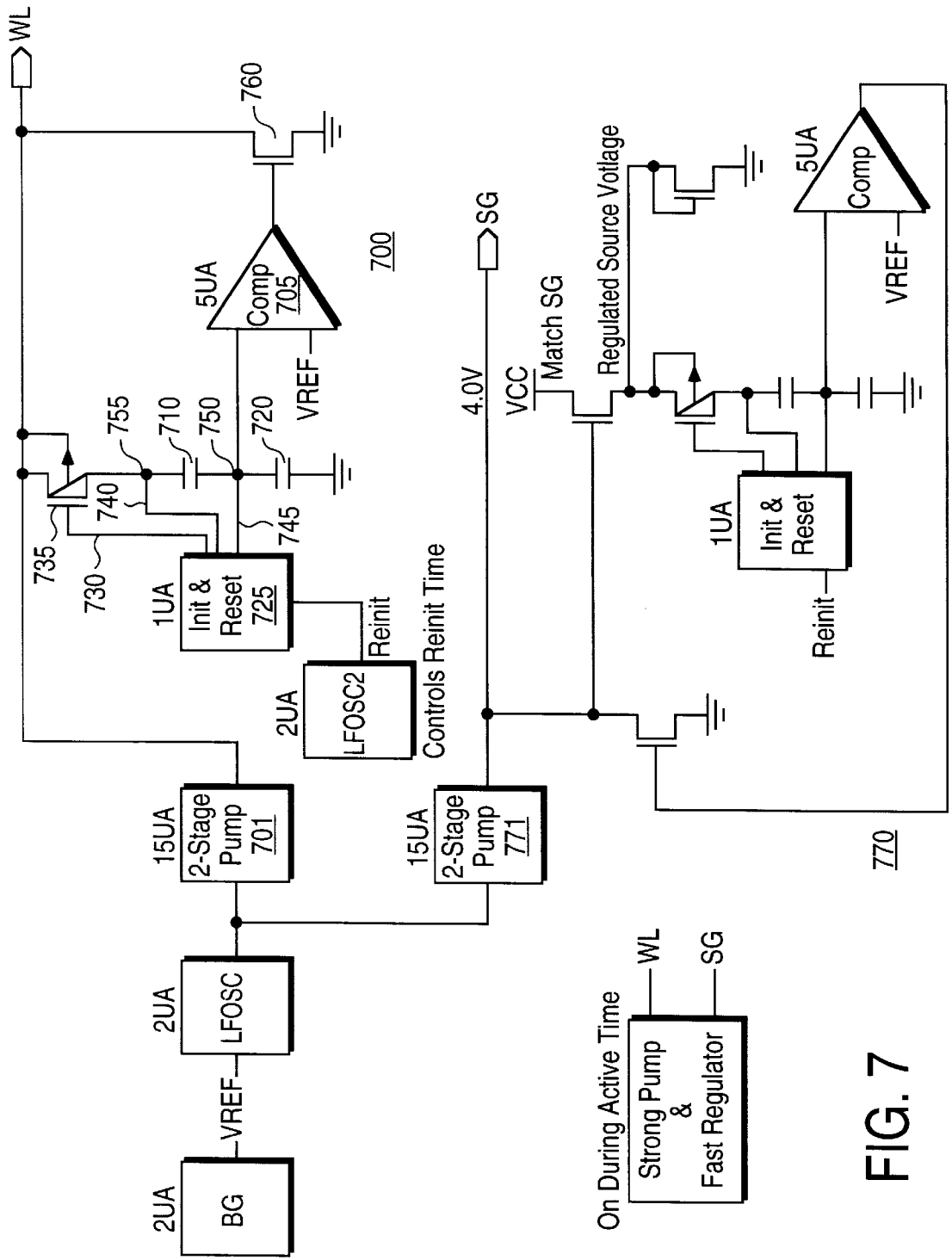
FIG. 7 is a block diagram of a circuit for performing the present invention.

FIG. 7 is a block diagram contain two circuits, 700 and 770, according to the present invention each having 2 stage pumps, 701 and 771 driven by a single low frequency oscillator LFOSC. Each circuit provides a regulated power supply to a line (Word Line WL in 700, and Select Gate line SG in 771). The pumps, 701 and 771, if left unregulated would drive each of the Word line WL and SG too high for proper circuit operations.

Referring to circuit 700, a capacitor divider circuit is connected to the Word line WL, including capacitors 710, 720. A divided node 750 of the capacitor divider circuit is divided by a supplied capacitor 710 (0.4 pF, for example) connected to the divided node 750 and the word line WL, and a coupled up capacitor 720 (0.7 pF, for example) connected to ground and the divided node 750. As will be appreciated by those of ordinary skill in the art, many other configurations of capacitors and connections are possible, for example, the couple up capacitor could be connected to another reference level other than ground.

The capacitor voltage divider circuit includes an init & reset (ir) device 725 that controls an initialization process of the supplied capacitor 710 and coupled up capacitor 720. The ir device 725 includes a control line (p-boost line 730) connected to a gate of a p-channel (p-boost) transistor 735. The ir device controls application of a gate voltage to p-channel (p-boost) transistor 735 that is configured to disconnect the supplied capacitor 710 from the word line WL.

The ir device 725 also includes a reset and initialize signal 740 to initialize the supplied capacitor 710, and a similar signal 745 for initializing the coupled up capacitor 720.

In one embodiment, initialization of the supplied and coupled up capacitors comprises discharging the capacitors (connecting each of nodes 750 and 755 to ground via reset and initialize signals 740 and 745. The ir device 725 operates as discussed above with regard to the steps of disconnecting the supplied capacitor from the voltage source (word line WL, in this example), initializing both capacitors, 710 and 720), and reconnecting the supplied capacitor to the voltage source. As discussed herein, the reinitialization can either be a complete grounding or zero out of the capacitors, or a predetermined amount of discharge sufficient to allow the proper voltage sample ratio to be maintained at node 750.

Also provided for operation of the sampling circuit is a device, procedure, or architecture of the sampling circuit such that the initialization process has either minimized or no effect on the voltage line or source being regulated. In the embodiment illustrated in FIG. 7, the circuit architecture, specifically the comparator 705, and VREF, are arranged such that when the initialization process is being performed the comparator senses that the voltage is not being regulated and the grounding transistor 760 is not activated (in other words, no shunting of word line WL is performed during the initialization process).

Other ways to maintain a status quo, or no operation, during the initialization process are also possible, disconnecting node 750 from the comparator along with an additional mechanism designed (connecting another small capacitor, for example) to maintain the voltage at the comparator just prior to initialization for the duration of the initialization process, for example.

In addition, the initialization time of capacitors 710 and 720, in the current embodiment, relative to a frequency of the pump, in very low (on the order of ½0th, ¹⁄₁₀₀th, or more that of the pump). Therefore, any spikes, dips, or other irregularities in regulation that might occur in other embodiments, as long as the pump frequencies are maintained at a higher order than required initialization time, are unlikely to substantially alter operation of the circuit.

Figure 8:
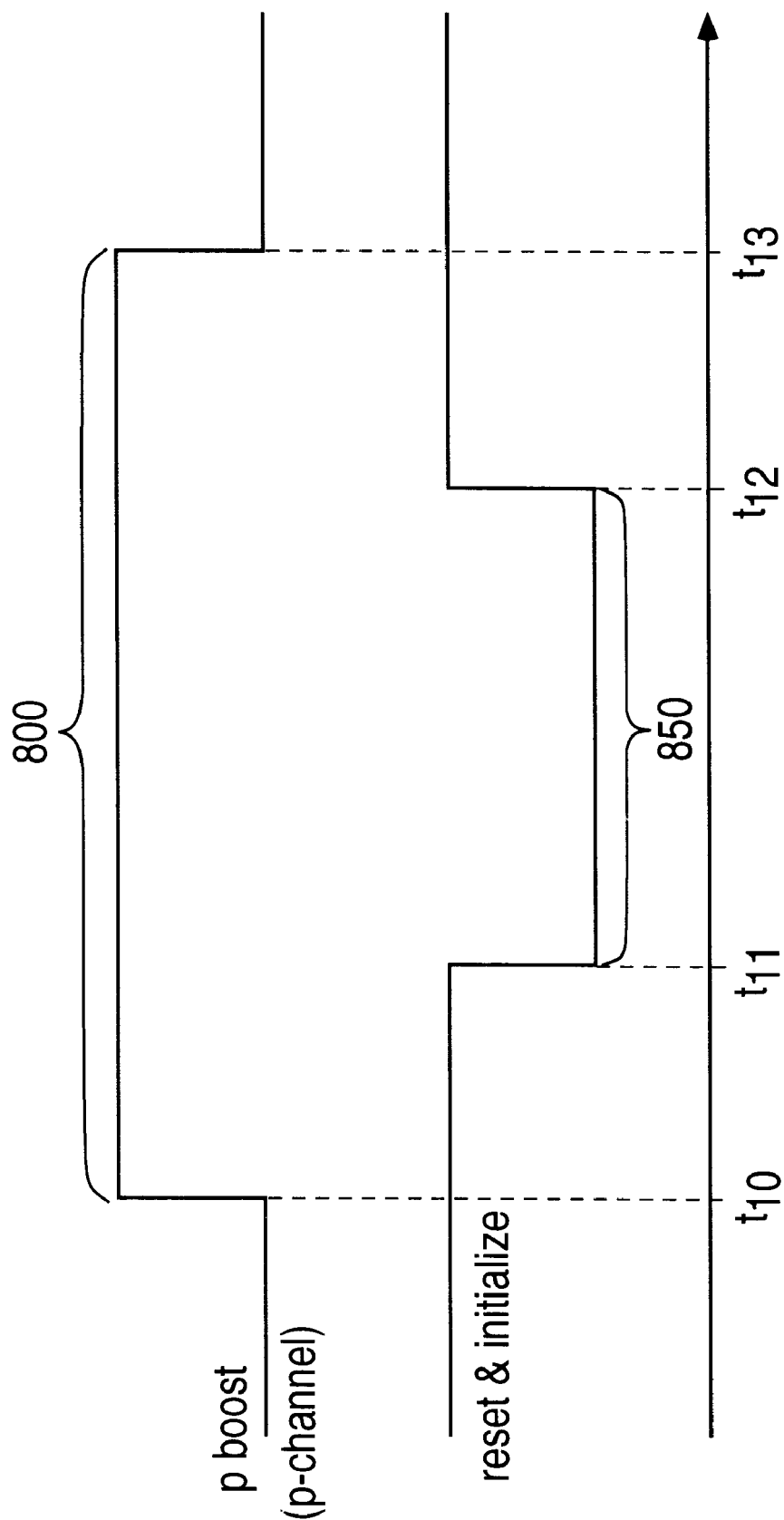
FIG. 8 is a timing diagram illustrating a relationship between a p-boost line and the reset/initialize signal.

In one embodiment, the ir device 725 operates in accordance with the timing diagram of FIG. 8, which shows activity of the p-boost line 730, which is active between $t_{10}$ and $t_{13}$, which activates the p-channel (p-boost) transistor 735, disconnecting the capacitor divider circuit. At time $t_{11}$–$t_{12}$, the reset and initialize signal goes low which indicates the ir device 725 is initializing the capacitors 710 and 720.

Alternatively, timing of the ir device 725 may be handled by a clocking mechanism entirely separate from the oscillator driving the voltage pump, so long as the capacitors are refreshed before being diminished beyond an acceptable threshold, due to charge leakage, for example. However, utilizing an existing oscillator has the advantage of re-using existing parts already present on an electronic device and is therefore an efficient implementation.

In addition, other advantages can be realized by timing the ir device from an oscillator driving the pump. For example, in the case where the oscillator frequency corresponds to actual pumps of voltage, or moments of pump inactivity, it may be advantageous to have the timing of the ir 725 in synch at a certain interval with the voltage pump such that the discharge of the capacitors occurs during a time of pump inactivity, rather than voltage production, for example. Other timing scenarios will be apparent based on the application and configuration of the capacitor divider circuit.

A comparator 705 is connected, by comparator inputs, to a divided node 750 of the capacitor divider circuit and to a reference voltage VREF. The VREF is any stable voltage source, or a voltage to be compared. An output line of the comparator 705 is connected to a gate of a grounding transistor 760 that is connected between ground and the Word line WL.

In operation, voltage on the word line is sampled and divided by the capacitors 710 and 720. The divided voltage sample (at node 750) is input to the comparator 705 where it is compared to the reference voltage VREF. While the divided voltage sample is less than VREF, the output of comparator 705 is in a lower region, leaving the grounding transistor in an off condition not affecting the word line WL. However, once the divided voltage sample reaches more than VREF, the comparator then output reaches a higher region where the grounding transistor is active, or turned on, which causes a shunt current to flow between the word line WL and ground. In this example, VREF would be supplied such that the grounding transistor would be inactive (open, not affecting the word line WL voltage), until the pump began charging the word line WL above a 3.5 v level. Thus the VREF would be provided based on a voltage present at the divided node when 3.5 v is present on the word line WL.

However, the comparator provides a continuous signal to the grounding transistor 760, and, because the transistor does not operate as an absolute switch, a small amount of shunting occurs below a WL level of 3.5 v, up to full shunting at some point above a 3.5 v WL level.

As stated above many other configurations are possible. For example, the comparator could be configured to provide only an absolute low of high signal to the grounding transistor 760, forcing the transistor to operate in a more switch like fashion, however, such a configuration might cause irregularities in the WL line voltage level or pump operation. Also, the output from the comparator, or another comparison circuit could be fed back to the pump 701, shutting it down for one or two cycles when the voltage reaches a predetermined threshold (the above stated fraction of 3.5 v, for example). Regardless of the feedback mechanism for controlling the pump output, the present invention provides the divided voltage without current drain from the line being tested. Or, in yet another alternative, the grounding transistor could be replaced with another device for regulating a shunt path between the word line WL and ground (a variable resistor, for example).

Circuit 771, has many components similar to those described in circuit 700 for regulating a select gate voltage. Circuit 771 utilizes a slightly different line configuration and demonstrates how plural divided sampled voltage schemes may be reinitialized from a single reinit signal and having pumps driven by a single oscillator (LFOSC).

The present invention may also be configured to sample voltages for comparison in determining a logic level represented by the sampled voltage, such as inside a memory cell or other device. The present invention may be applied to any device that samples a voltage, and is particularly advantageous in situations where continuous low power drain sampling is needed.

Figure 9:
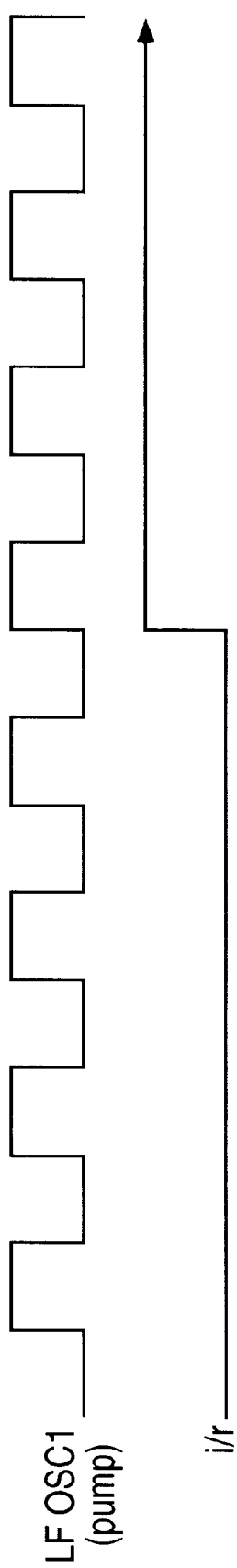
FIG. 9 illustrates an example where a ratio between a frequency of an oscillator and initialize/reset signals.

As discussed above, the present inventor has also determined that coupling a timing of the ir device 725 to a frequency generator LFOSC2. The LFOSC2 provides a frequency to the ir device 725 that controls a timing of the p-boost 730 and reset 740 signals. The provided frequency is sufficient to provide timing consistent with the requirements of the capacitor divider circuit. FIG. 9 illustrates an example where a ratio between a frequency of an oscillator and the initialize and reset signals provide timing for the reset and initialize signal.

Figure 10:
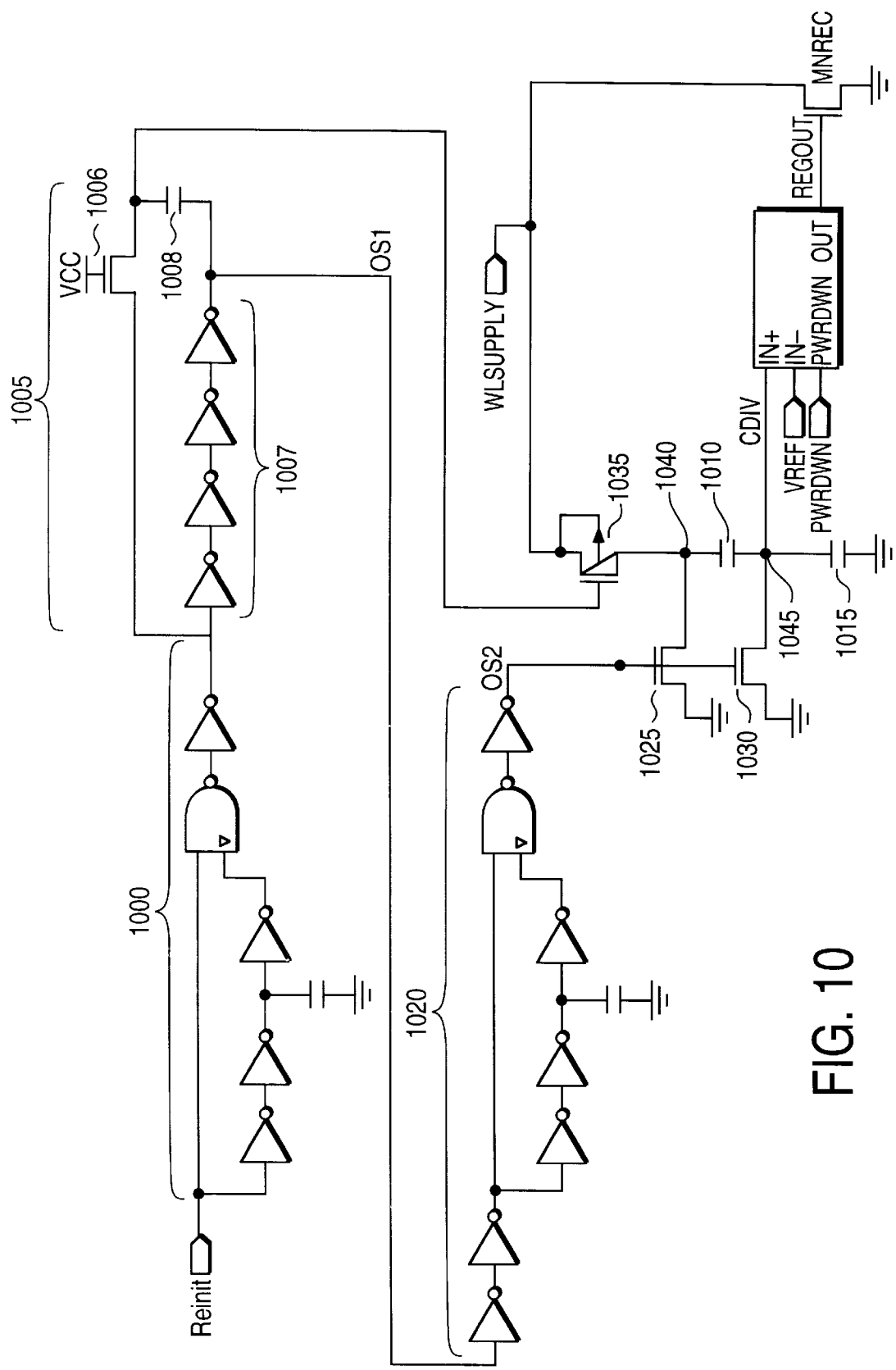
FIG. 10 is a block circuit diagram of one possible implementation of an initialize and reset device.

FIG. 10 illustrates another embodiment and one possible implementation of the ir device 725. A REINIT signal (from LFOSC2, for example) is provided to input circuitry 1000 that accepts the REINIT signal which is then produces a PBOOST signal and OS1 signal via split/boost circuitry 1005. Split/boost circuitry 1005 includes an upper path connecting the input circuitry 1000 and to a first terminal of transistor 1006. A gate of transistor 1006 is connected to VCC, and a second terminal of transistor 1006 is connected to a PBOOST line for activating the p-channel transistor 1035. Split/boost circuitry 1005, also includes a lower path that includes a series of inverters 1007 that act as a delay circuit, and a capacitor 1008 (0.25PF, for example) connected to the series inverters and the PBOOST line.

In operation, the capacitor 1008 is charged up to a level of approximately VCC (VCC-$V_{Threshold}$ of transistor 1006, see FIG. 10, for example). Then, the delay signal kicks in (in about 1.05 usecs, for example), and because the voltage across the capacitor does not change, the PBOOST line signal is boosted to a higher voltage level. The PBOOST signal is applied to a p-channel transistor 1035 which then disconnects a supplied capacitor 1035 from a word line supply WLSUPPLY.

In this embodiment, because the word line supply WLSUPPLY is being boosted above a level of VCC (an external power supply of the device), in order to achieve a disconnection of the supplied capacitor 1035 from the word line WLSUPPLY, a voltage applied to the gate of p-channel transistor 1035 is boosted higher than a voltage of the word line WLSUPPLY (a boost up to at least a voltage of WLSUPPLY may also suffice, however, a boost above the WLSUPPLY level provides better assurance of a good disconnect).

The OS1 signal is delayed by delay circuitry 1020 and then provided as a control signal activating both grounding transistor 1025 (coupled between p-channel transistor 1035 and supplied capacitor 1010) and grounding transistor 1030 (coupled between a divided node 140 and ground). The delay of circuit 1020 is calculated so the PBOOST signal and operation of transistor 1035, disconnecting the supplied capacitor 1010, is complete before grounding transistors 1025 and 1030 re-initialize the supplied capacitor 1010 and coupled up capacitors 1015 by discharging (a full discharge is primarily envisioned, however a partial discharge may also be sufficient to maintain a proper charge in the coupled up capacitor, which would then be fully consistent with the present invention). Delay circuit 1020 also provides an appropriate voltage level to assure solid ground contacts for each of grounding transistors 1025 and 1030.

In FIG. 10, the divided voltage (at divided node 1045) is provided to an lpreg (low power regulator, which is a differential comparator), along with a reference voltage VREF, and a power down control signal PWRDWN. The lpreg utilizes these inputs to provide a regulator output signal REGOUT that controls a transistor MNREG, coupled between WLSUPPLY and ground, that, when activated, pulls the WLSUPPLY line low, thus providing an additional example of how the present invention is applicable within another device. As will be appreciated by those of ordinary skill in the art, the circuits of FIG. 10 can take on many different configurations, still consistent with the teachings herein. Generally speaking the present invention will be highly sought for use in any device that requires a sampled voltage where limited current drain is desired.

Figure 11:
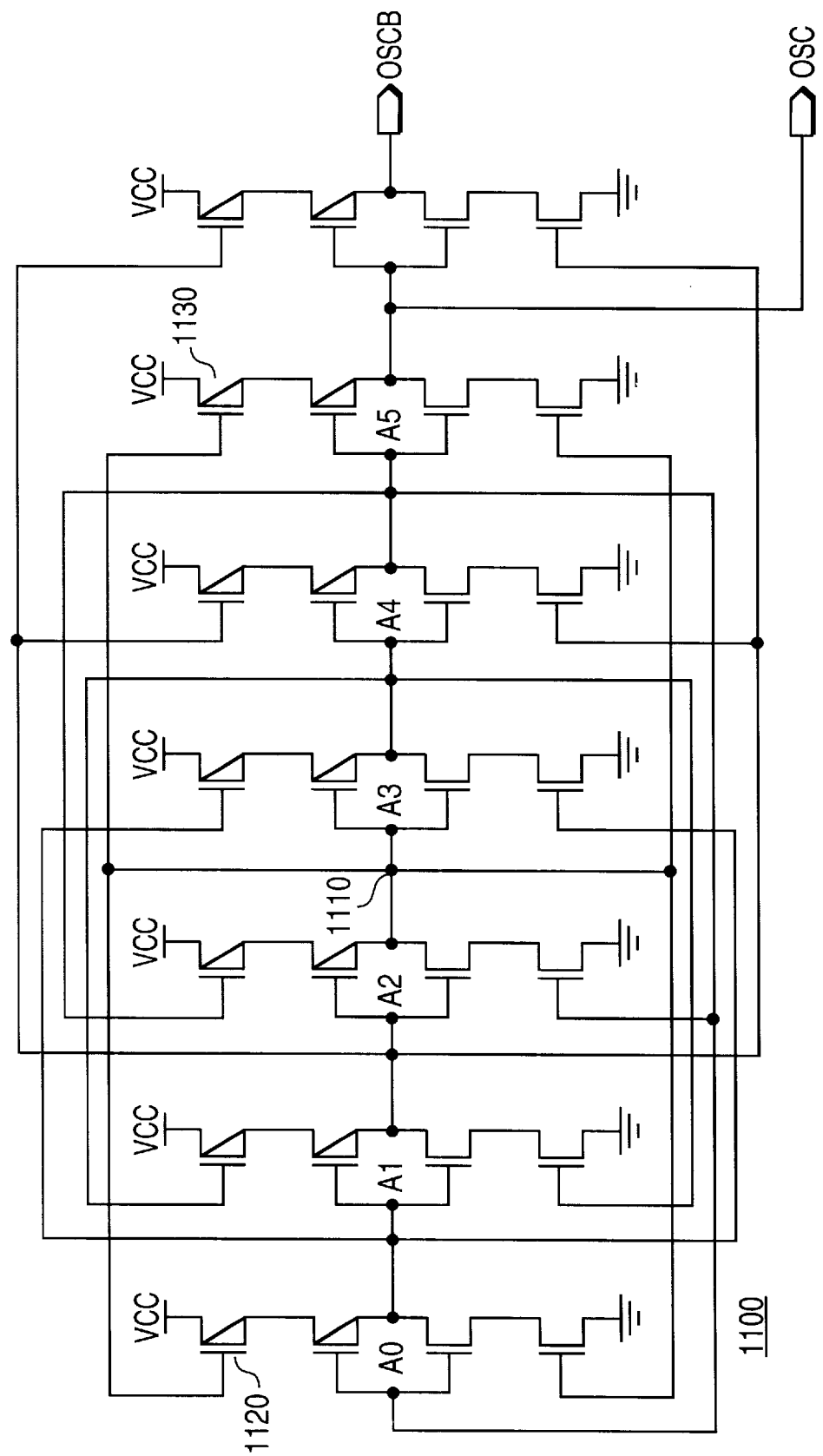
FIGS. 11, 12, and 13 each show alternate embodiments for each of the circuits described above.

FIG. 11 is an example of a low frequency oscillator 1100 (LFOSC of FIG. 7, for example). The oscillator 1100 is similar to a traditional ring oscillator with some additional circuitry making it low power (tri-stating p-channel and n-channel transistors, on the top of each inverter, controlled by the previous 2 inverter stages—note that node 1110 between stages A2 and A3 feeds each of transistors 1120 and 1130 at stages A0 and A5, respectively). In a traditional ring oscillator, power is wasted from VCC to ground because as each stage changes that occurs during a time period that is also driving the next stage, resulting in non-sharp transitions between each stage in the ring oscillator. Here, in FIG. 11, power is allowed to flow to the inverter only once the input to the inverter reaches a full level (full VCC or full VSS).

Figure 12:
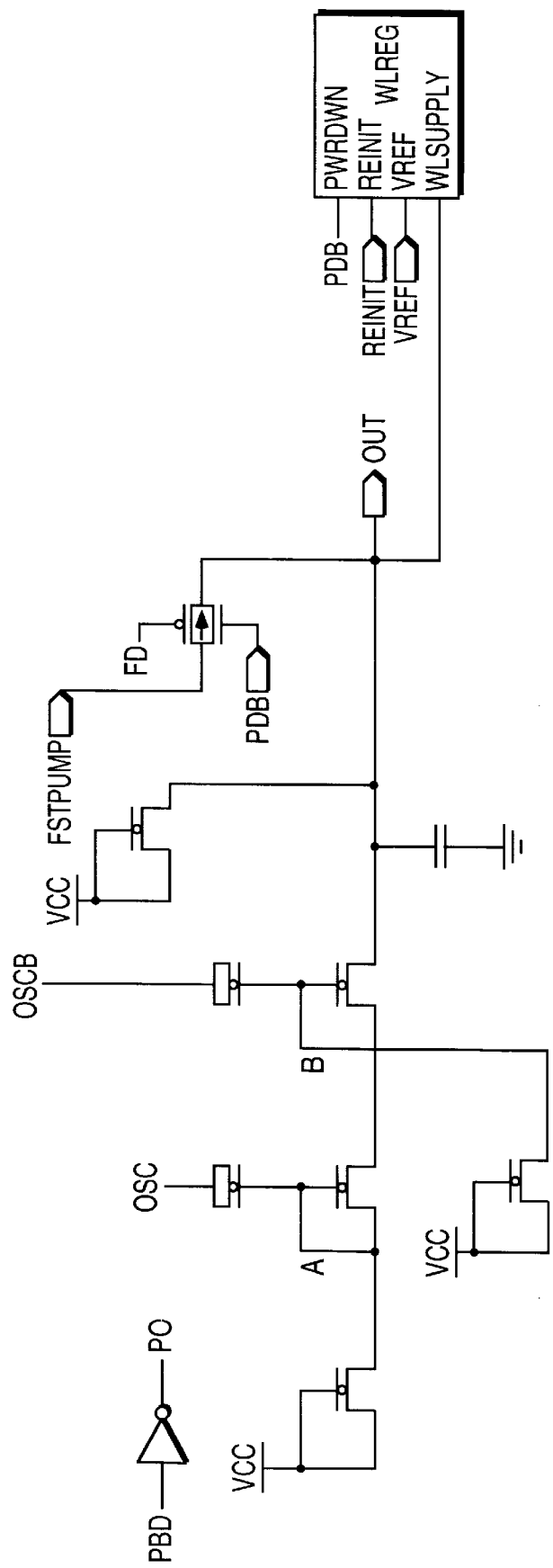

FIG. 12 illustrates a two stage pump 1200 that could be utilized as pump 701 or pump 771 as illustrated in FIG. 7. The two stage pump 1200 takes a standard VCC input voltage and pumps it up to a higher voltage.

Figure 13:
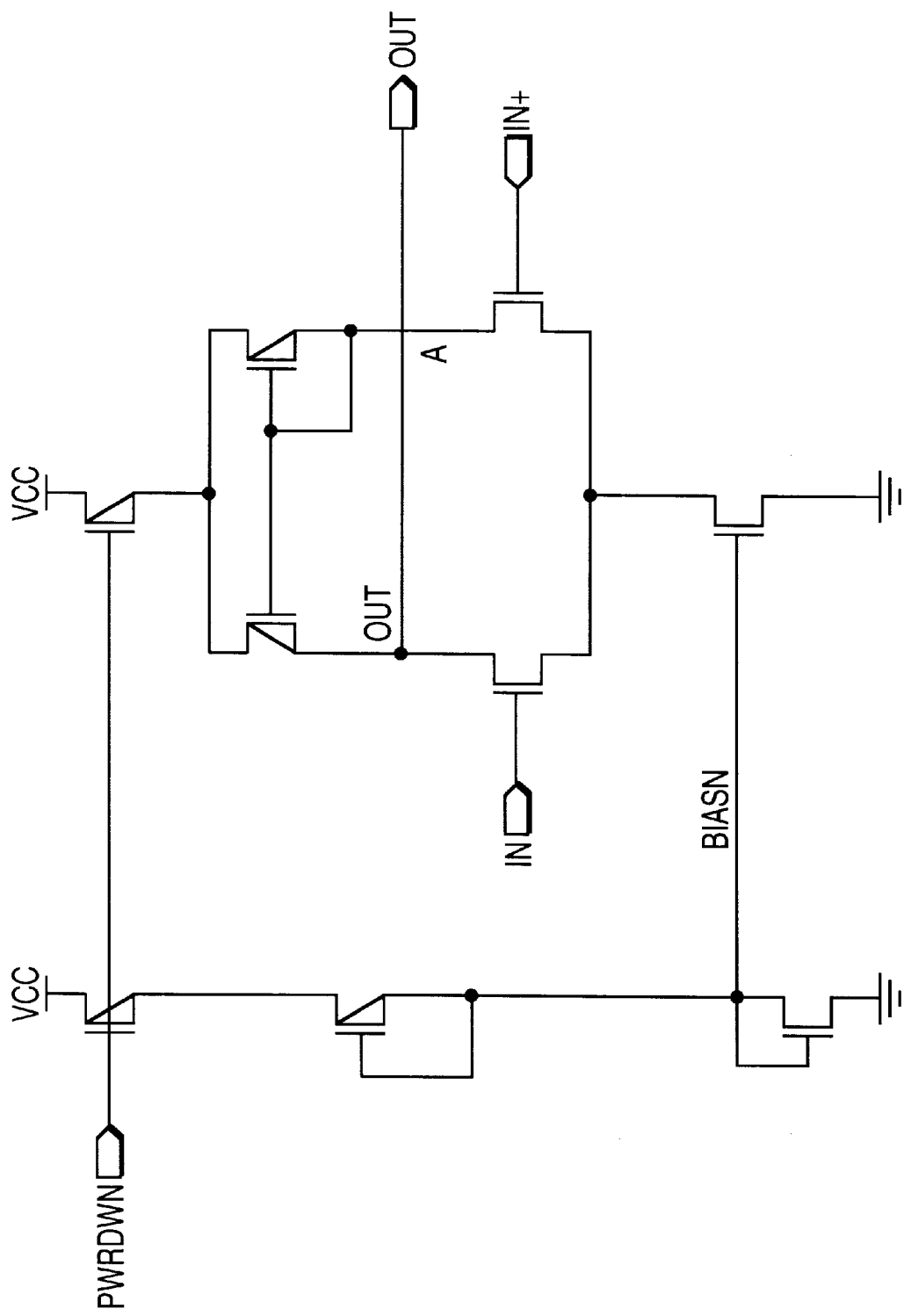

FIG. 13 is an example of a differential comparator (lpreg of FIG. 10 for example) having an active load and a current source. The differential comparator compares an IN+ signal to an IN− signal, which if approximately equal will maintain a mid-level signal on an OUT line. If IN+ is above IN−, the OUT signal goes high, and if N+ is below N−, the OUT signal goes low. Other comparison circuits may be utilized.

Figure 14:
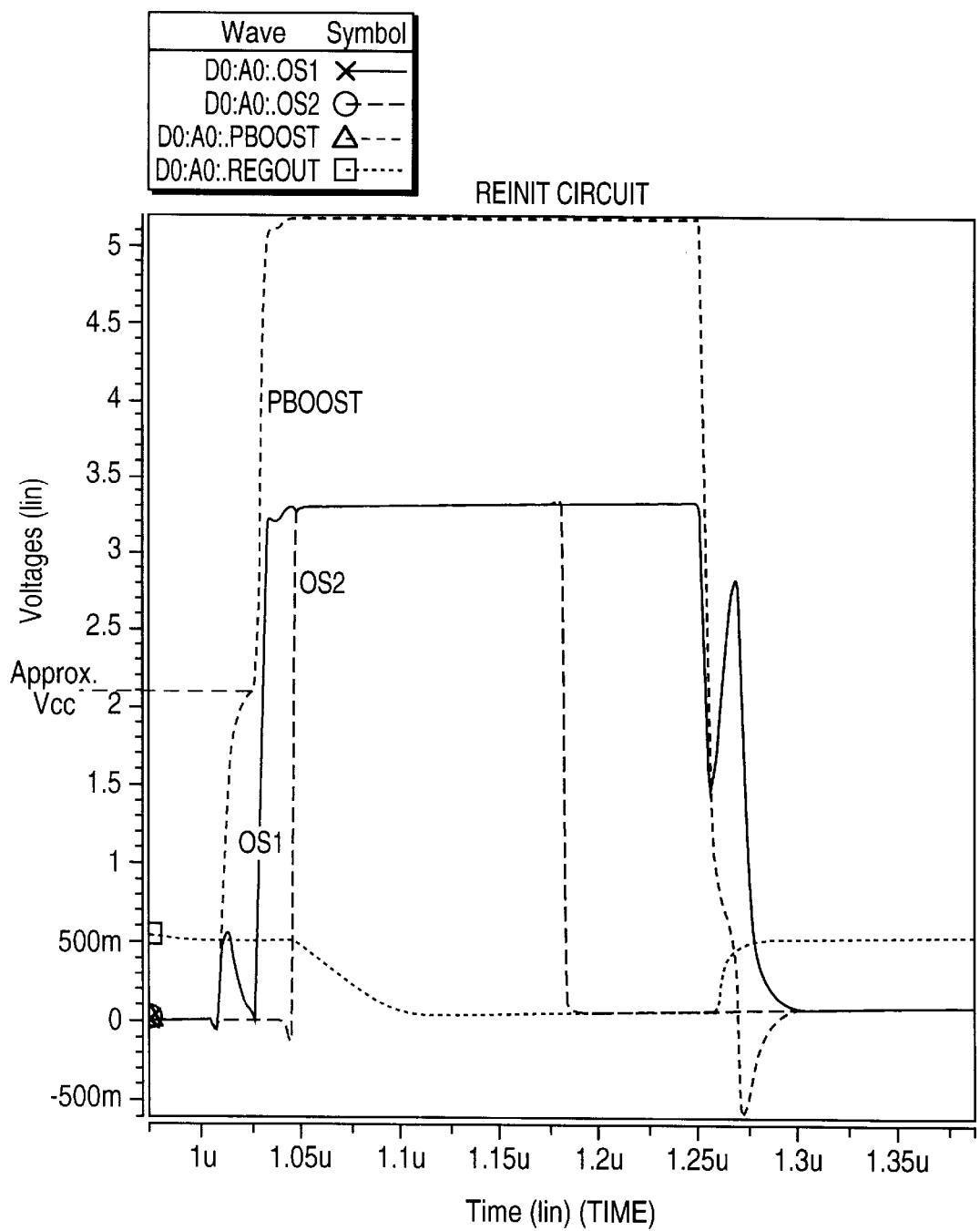
FIG. 14 is a voltage and timing diagram illustrating responses for each of the PBOOST, OS1, and OS2 signals described in FIG. 10.

FIG. 14 illustrates responses for each of the PBOOST, OS1, and OS2 signals described above for the circuit as illustrated in FIG. 10. As will be appreciated by those of ordinary skill in the art, any circuit implementing a similar signal or timing arrange may be substituted for the circuit shown in FIG. 10.

In FIG. 14, the PBOOST signal is first activated (disconnecting the supplied capacitor 1010), and remains active for about 0.2–0.25 useconds (usecs). During this time period OS1 and then OS2 are subsequently activated (OS1 in approx 0.025 usecs, and OS2 approx 0.025 usecs after OS1). Two important aspects of the timing are:

1) the length pboost remains active (which needs to encompass the period that the capacitors (1010 and 1015) are being discharged to prevent the discharging circuitry from affecting the WLSUPPLY); and
2) the length of time OS2 remains active (which needs to remain active long enough to incur sufficient discharge of the capacitors (1010 and 1015)).

Figure 15:
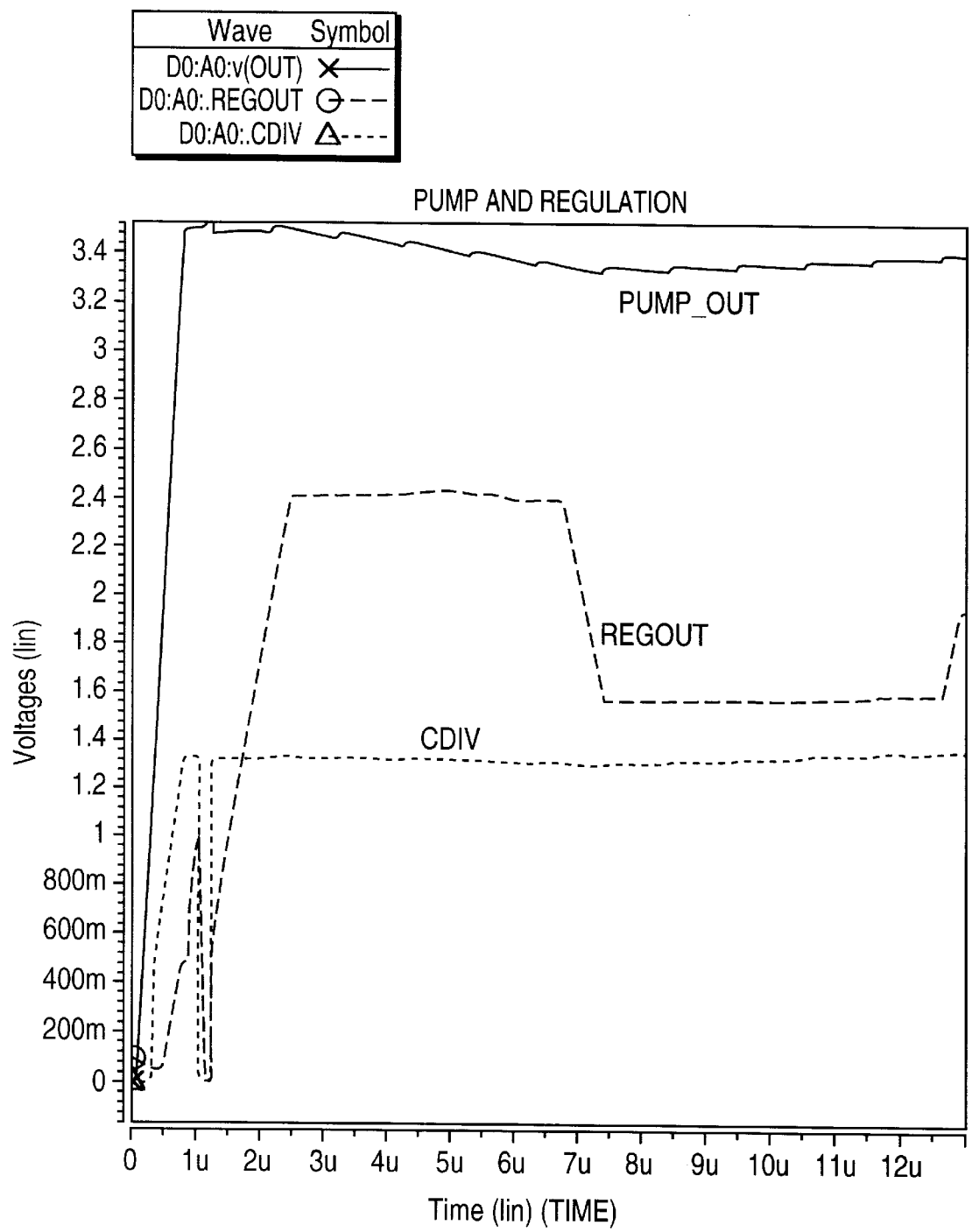
FIGS. 15–16 illustrates a timing and voltage diagram illustrating levels for the above illustrated circuits.
Figure 16:
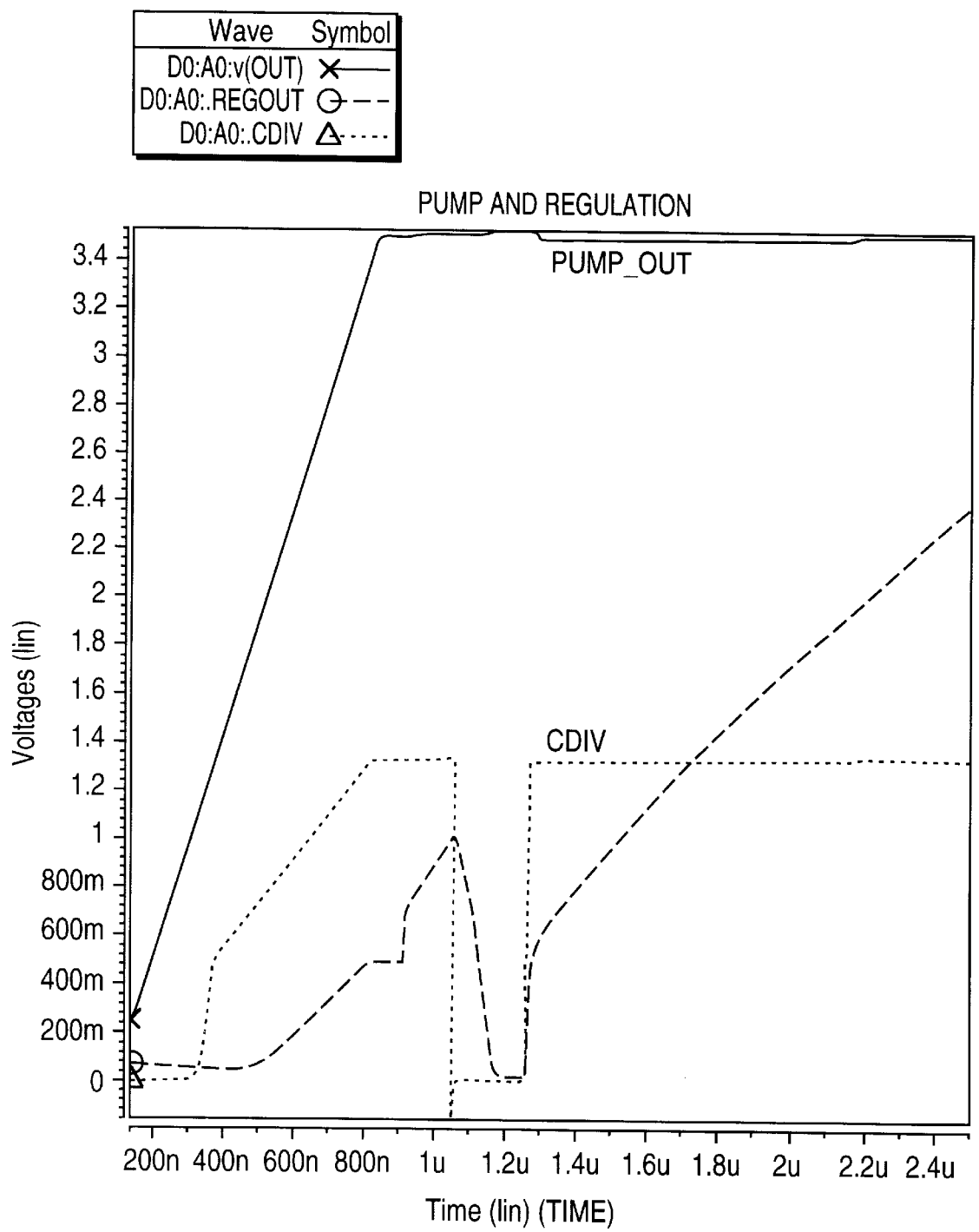

FIG. 15 illustrates a timing and voltage level PUMP_OUT for the pump 701 attached to the word line WL of FIG. 7. The waveform of PUMP_OUT illustrates continuous pumping of the pump 701 even during a regulation period (when REGOUT, comparator 700 output, is high). FIG. 16 illustrates a timing and voltage diagram according to an aspect of the present invention.

In addition to an embodiment consisting of specifically designed integrated circuits or other electronics, the present invention may be conveniently implemented using a conventional general purpose or a specialized digital computer or microprocessor programmed according to the teachings of the present disclosure, as will be apparent to those skilled in the computer art.

Appropriate software coding can readily be prepared by skilled programmers based on the teachings of the present disclosure, as will be apparent to those skilled in the software art. The invention may also be implemented by the preparation of application specific integrated circuits or by interconnecting an appropriate network of conventional component circuits, as will be readily apparent to those skilled in the art.

The present invention includes a computer program product which is a storage medium (media) having instructions stored thereon/in which can be used to program a computer to perform any of the processes of the present invention. The storage medium can include, but is not limited to, any type of disk including floppy disks, optical discs, DVD, CD-ROMs, microdrive, and magneto-optical disks, ROMs, RAMS, EPROMs, EEPROMS, DRAMs, VRAMs, flash memory devices, magnetic or optical cards, nanosystems (including molecular memory ICs), or any type of media or device suitable for storing instructions and/or data.

Stored on any one of the computer readable medium (media), the present invention includes software for controlling both the hardware of the general purpose/specialized computer or microprocessor, and for enabling the computer or microprocessor to interact with a human user or other mechanism utilizing the results of the present invention. Such software may include, but is not limited to, device drivers, operating systems, and user applications. Ultimately, such computer readable media further includes software for performing at least one of additive model representation and reconstruction.

Included in the programming (software) of the general/specialized computer or microprocessor are software modules for implementing the teachings of the present invention, including, but not limited to, separating planes of a source image, averaging at least one of foreground and background colors, replacing colors, and compensating for error introduced by color replacement in one plane by feeding error into a second plane, storage, and communication of results according to the processes of the present invention.

Obviously, numerous modifications and variations of the present invention are possible in light of the above teachings. It is therefore to be understood that within the scope of the appended claims, the invention may be practiced otherwise than as specifically described herein.

What is claimed is:

1. A regulated voltage supply, comprising:
   a voltage source;
   a sampling circuit connected to an output of said voltage source and configured to sample the output without drawing current from said voltage source;
   a feedback circuit configured to provide a signal that adjusts an amount of voltage supplied at the output based on the sampled output; and,
   a refresh circuit connected to said sampling circuit and configured to refresh the sampling circuit so that a voltage of the sampled output is not degraded, due to charge leakage, by more than a predetermined amount.

2. The regulated voltage supply according to claim 1, wherein:
   said sampling circuit includes a capacitor divider circuit having,
      a supplied capacitor connected to the voltage source output and a sampling node and,
      a coupled up capacitor connected to the sampling node and another terminal.

3. The regulated voltage supply according to claim 2, wherein:
   said refresh circuit includes:
      an isolation mechanism connected to the supplied capacitor and configured to isolate the supplied capacitor from the voltage source;
      a discharge mechanism connected to each of the supplied capacitor and coupled up capacitor, and configured to discharge the supplied capacitor and coupled up capacitor to a predetermined level; and,
      a control mechanism, connected to each of said isolation mechanism and said discharge mechanism, configured to refresh the supplied capacitor by controlling said isolation mechanism and said discharge mechanism so as to isolate the supplied capacitor from the voltage source for a period of time during which the supplied capacitor and the coupled up capacitor are discharged, such that a degradation of charge stored in the coupled up capacitor, due to charge leakage, is not more than a predetermined amount.

4. The regulated voltage supply according to claim 3, further comprising:
   a timing mechanism connected to said control mechanism and configured to activate refresh operations of said control mechanism, including:
      a counter connected to an internal clocking mechanism of the regulated voltage supply that supplies a REINIT signal at a predetermined count of the clocking mechanism; and,
      a signal circuit configured to produce an isolation signal for timing the isolation of said supplied capacitor by said isolation mechanism, and a discharge signal for timing the discharge of said supplied capacitor by said discharge mechanism during isolation of said supplied capacitor.

5. The regulated voltage supply according to claim 4, wherein said signal circuit provides each of said isolation and discharge signals during an interval when an irregular sampled voltage would least influence operation of at least one of the regulated voltage supply and a circuit attached to the regulated voltage supply.

6. A circuit, comprising:

a sampling circuit having a sampling node; and a refresh circuit configured to refresh the sampling circuit at an interval rate of less than an amount of time that charge leakage of the sampling circuit degrades a voltage measurement made at the sampling node beyond a threshold amount;

wherein said sampling circuit includes:
  a supplied capacitor connected to a voltage output and said sampling node; and
  a coupled up capacitor connected to said sampling node and another terminal; and wherein said refresh circuit includes;
  an isolation mechanism connected to the supplied capacitor and configured to isolate the supplied capacitor from the voltage output;
  discharge mechanism connected to the supplied capacitor and the coupled up capacitor, and configured to discharge the supplied capacitor and the coupled up capacitor to a predetermined level;
  a timing mechanism configured to activate said refresh circuit; and,
  a control mechanism connected to each of said isolation mechanism, discharge mechanism, and timing mechanism and configured to refresh the supplied capacitor, at an interval according to said timing mechanism, such that a degradation of charge stored in the coupled up capacitor, due to charge leakage, is not more than a predetermined amount.

7. A method of sampling voltage, comprising the steps of:

retrieving a voltage from a divided node of a capacitor divider circuit having a supplied capacitor and a coupled up capacitor;

refreshing the capacitor divider circuit at an interval rate of less time than an amount of time for charge leakage of the capacitor circuit to degrade the voltage retrieved from the divided node, wherein said step of refreshing includes the steps of:
  disconnecting the supplied capacitor from a voltage source being divided by the capacitor divider circuit;
  discharging the supplied capacitor and the coupled up capacitor; and
  re-connecting the supplied capacitor to the voltage source being divided by the capacitor divider circuit.

8. The method according to claim 7, wherein said step of discharging includes the steps of:

attaching at least one terminal from each of the supplied capacitor and the coupled up capacitor to ground; and, removing the attached grounds.

9. A method of sampling voltage, comprising the steps of:

retrieving a voltage from a divided node of a capacitor divider circuit having a supplied capacitor and a coupled up capacitor;

refreshing the capacitor divider circuit at an interval rate of less time than an amount of time for charge leakage of the capacitor circuit to degrade the voltage retrieved from the divided node, wherein said step of refreshing includes the steps of:
  activating a transistor configured to isolate the supplied capacitor from a voltage source being divided by the capacitor divider circuit;
  grounding each of terminals of the supplied capacitor and the coupled up capacitor for a length of time sufficient to discharge the supplied capacitor to at least a predetermined level;
  un-grounding said terminals; and,
  dis-activating the transistor to re-connect the discharged supplied capacitor.

10. A method of sampling voltage, comprising the steps of:

retrieving a voltage from a divided node of a capacitor divider circuit having a supplied capacitor and a coupled up capacitor;

refreshing the capacitor divider circuit at an interval rate of less time than an amount of time for charge leakage of the capacitor circuit to degrade the voltage retrieved from the divided node, wherein said step of refreshing the capacitor divider circuit, includes the steps of:
  disconnecting the capacitor divider circuit from the voltage source it divides;
  discharging the supplied capacitor and the coupled up capacitor while the capacitor circuit is disconnected from the voltage source it divides;
  reconnecting the capacitor divider circuit to the voltage source; and,
  performing each sub-step of disconnecting, discharging, and reconnecting in a periodic interval so that a charge level of the coupled up capacitor is not diminished, due to charge leakage, beyond a predetermined amount.

11. A method of sampling voltage, comprising the steps of:

retrieving a voltage from a divided node of a capacitor divider circuit having a supplied capacitor and a coupled up capacitor;

refreshing the capacitor divider circuit at an interval rate of less time than an amount of time for charge leakage of the capacitor circuit to degrade the voltage retrieved from the divided node, wherein said step of refreshing comprises:
  counting an internal oscillator to determine a timing of the interval rate;
  generating an isolation signal configured to isolate the supplied capacitor;
  generating a grounding signal configured to discharge the supplied capacitor after the supplied capacitor has been isolated; and,
  relinquishing said grounding signal before relinquishing said isolation signal.

12. A computer readable media, having instructions stored thereon, wherein, said instructions, when executed by a computer, cause the computer to perform a method that comprises the steps of:

retrieving a voltage from a divided node of a capacitor divider circuit having a supplied capacitor and a coupled up capacitor; and, refreshing the capacitor divider circuit at an interval rate of less time than an amount of time for charge leakage of the capacitor circuit to degrade the voltage retrieved from the divided node.

13. The computer readable media according to claim 12, wherein said step of refreshing includes the steps of:

disconnecting the supplied capacitor from the capacitor divider circuit;

discharging the supplied capacitor; and, re-connecting the discharged supplied capacitor to the capacitor divider circuit.

14. The computer readable media according to claim 13, wherein said step of refreshing includes the steps of:

attaching each of terminals of the supplied capacitor to ground; and removing the attached grounds.

15. The computer readable media according to claim 12, wherein said step of refreshing includes the steps of:

activating a transistor configured to isolate the supplied capacitor upon activation;

grounding each of terminals of the supplied capacitor for a length of time sufficient to discharge the supplied capacitor to at least a predetermined level;

un-grounding said terminals; and, dis-activating the transistor to re-connect the discharged supplied capacitor.

16. The computer readable media according to claim 12, wherein said step of refreshing the capacitor divider circuit, includes the steps of:

disconnecting the capacitor divider circuit from the voltage source it divides;

discharging the supplied capacitor while the capacitor circuit is disconnected from the voltage source it divides;

reconnecting the capacitor divider circuit to the voltage source; and, performing each step of disconnecting, discharging, and reconnecting in a periodic interval so that a charge level of the coupled up capacitor is not diminished, due to charge leakage, beyond a predetermined amount.

17. The computer readable media according to claim 12, wherein said step of refreshing includes the steps of:

counting an internal oscillator to determine a timing of the interval rate;

generating an isolation signal configured to isolate the supplied capacitor;

generating a grounding signal configured to discharge the supplied capacitor after the supplied capacitor has been isolated; and, relinquishing said grounding signal before relinquishing said isolation signal.

* * * * *